(12) United States Patent
Wu

(10) Patent No.: US 10,818,543 B2
(45) Date of Patent: Oct. 27, 2020

(54) SOURCE/DRAIN CONTACT SPACERS AND METHODS OF FORMING SAME

(71) Applicant: Taiwan Semiconductor Manufacturing Co., Ltd., Hsin-Chu (TW)

(72) Inventor: Xusheng Wu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 20 days.

(21) Appl. No.: 16/217,676

(22) Filed: Dec. 12, 2018

(65) Prior Publication Data

US 2020/0035549 A1  Jan. 30, 2020

Related U.S. Application Data

(60) Provisional application No. 62/711,754, filed on Jul. 30, 2018.

(51) Int. Cl.
| | |
|---|---|
| *H01L 21/8234* | (2006.01) |
| *H01L 21/768* | (2006.01) |
| *H01L 21/308* | (2006.01) |
| *H01L 29/417* | (2006.01) |
| *H01L 21/265* | (2006.01) |
| *H01L 29/66* | (2006.01) |

(52) U.S. Cl.
CPC ...... *H01L 21/76832* (2013.01); *H01L 21/265* (2013.01); *H01L 21/3086* (2013.01); *H01L 21/823418* (2013.01); *H01L 29/41791* (2013.01); *H01L 29/6656* (2013.01)

(58) Field of Classification Search
CPC ................. H01L 21/823418; H01L 21/76832
See application file for complete search history.

(56) References Cited

U.S. PATENT DOCUMENTS

| | | | |
|---|---|---|---|
| 9,385,030 B2 | 7/2016 | Lee et al. | |
| 9,922,978 B2* | 3/2018 | Ching | H01L 29/6653 |
| 10,153,351 B2* | 12/2018 | Hsu | H01L 21/76832 |
| 2014/0346605 A1 | 11/2014 | Zeitzoff et al. | |
| 2016/0149040 A1 | 5/2016 | Lee et al. | |
| 2017/0117390 A1 | 4/2017 | Lee et al. | |

* cited by examiner

*Primary Examiner* — Mark V Prenty
(74) *Attorney, Agent, or Firm* — Haynes and Boone, LLP

(57) ABSTRACT

Source/drain contact spacers for improving integrated circuit device performance and methods of forming such are disclosed herein. An exemplary method includes etching an interlevel dielectric (ILD) layer to form a source/drain contact opening that exposes a contact etch stop layer (CESL) disposed over a source/drain feature, depositing a source/drain contact spacer layer that partially fills the source/drain contact opening and covers the ILD layer and the exposed CESL, and etching the source/drain contact spacer layer and the CESL to extend the source/drain contact opening to expose the source/drain feature. The etching forms source/drain contact spacers. The method further includes forming a source/drain contact to the exposed source/drain feature in the extended source/drain contact opening. The source/drain contact is formed over the source/drain contact spacers and fills the extended source/drain contact opening. A silicide feature can be formed over the exposed source/drain feature before forming the source/drain contact.

20 Claims, 9 Drawing Sheets

SOURCE/DRAIN CONTACT SPACERS AND METHODS OF FORMING SAME

This is a non-provisional application of and claims benefit of U.S. Provisional Patent Application Ser. No. 62/711,754, filed Jul. 30, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, contacts of the MLI features are exhibiting increased contact resistance and impeding current flow, which presents performance, yield, and cost challenges. It has been observed that higher contact resistances and increasing current paths introduced by contacts in advanced IC technology nodes can significantly delay (and, in some situations, prevent) signals from being routed efficiently to and from IC devices, such as transistors, negating any improvements in performance of such IC devices in the advanced technology nodes. Accordingly, although existing contacts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
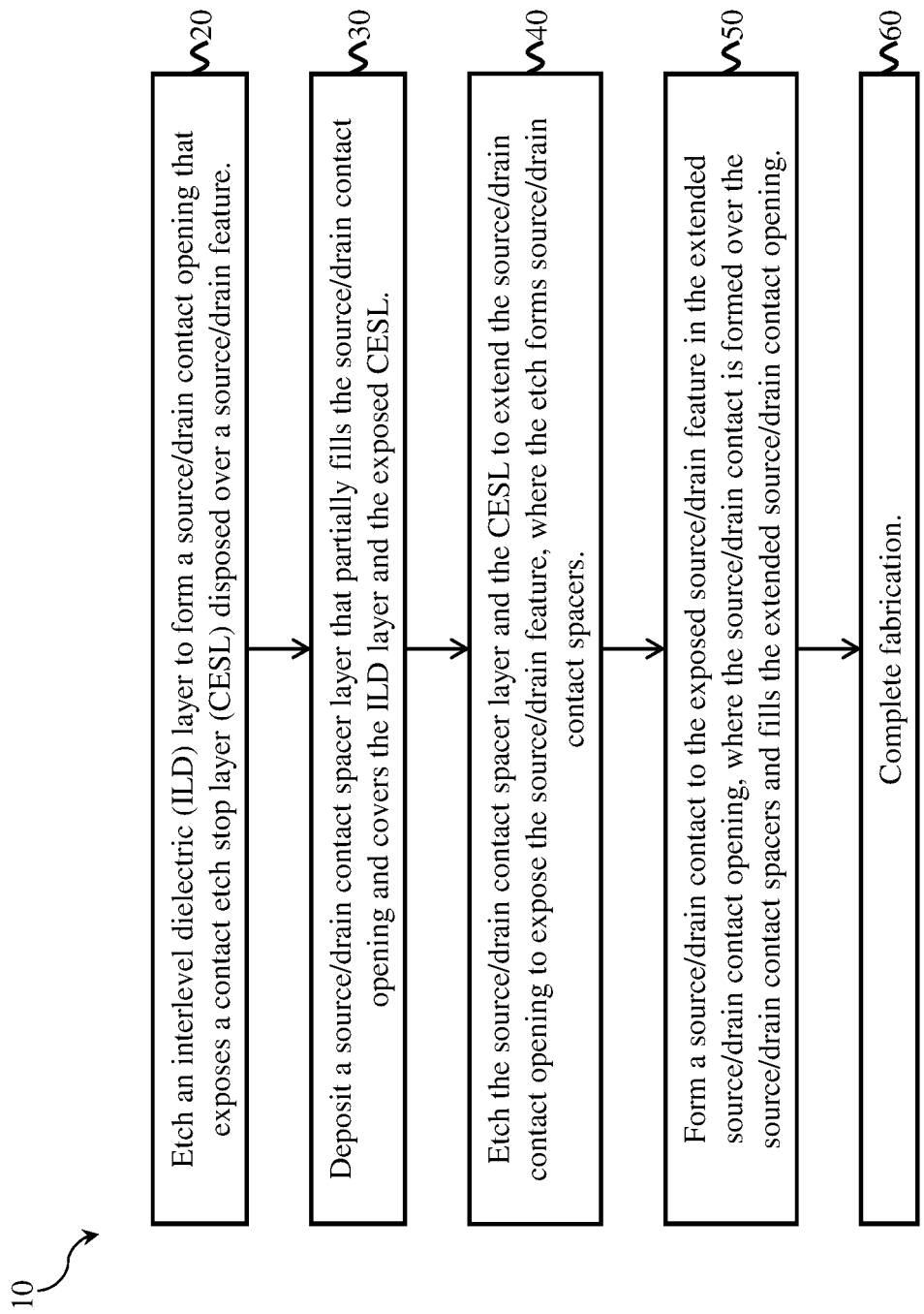
FIG. 1 is a flow chart of a method for fabricating a contact structure of an integrated circuit device according to various aspects of the present disclosure.

The present disclosure relates generally to integrated circuit (IC) devices, and more particularly, to contact structures of multi-layer interconnect features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to MEOL processes directed at fabricating source/drain contacts for planar IC devices and/or non-planar IC devices (for example, fin-like field effect transistors (FinFETs)). Conventional source/drain contact structures encroach into source/drain features, blocking current flow between source/drain contacts and channel regions of IC devices and/or causing longer than desirable current path lengths between source/drain contacts and channel regions, which increases parasitic source/drain resistance. Methods for fabricating source/drain contact structures disclosed herein form source/drain contact spacers that do not encroach into or physically contact source/drain features. Source/drain contact structures (which include the source/drain contacts and the source/drain contact spacers) disclosed herein have thus been observed to reduce current crowding, improve current paths between the source/drain contacts and the channel regions (for example, by decreasing current path lengths), and/or reduce parasitic source/drain resistance, thereby improving current flow between the source/drain contacts and channel regions of IC devices. Different embodiments may have different advantages, and no particular advantage is required of any embodiment.

FIG. 1 is a flow chart of a method 10 for fabricating a source/drain contact structure of an integrated circuit (IC) device according to various aspects of the present disclosure. At block 20, an interlevel dielectric (ILD) layer is etched to form a source/drain contact opening that exposes a contact etch stop layer (CESL) disposed over a source/drain feature. In some implementations, a material of the ILD layer is different than a material of the CESL, such that the ILD layer is selectively etched relative to the CESL. At block 30, a source/drain contact spacer layer is deposited that partially fills the source/drain contact opening and covers the ILD layer and the exposed CESL. In some implementations, a material of the source/drain contact spacer layer is substantially the same as the material of the CESL. In some implementations, the ILD layer includes oxygen, the CESL includes nitrogen, and the source/drain contact spacer layer includes nitrogen. At block 40, the source/drain contact spacer layer and the CESL are etched to extend the source/drain contact opening to expose the source/drain feature. The etching modifies the source/drain contact spacer layer to form source/drain contact spacers that define sidewalls of the extended source/drain contact opening. In some implementations, the etching removes a portion of the exposed source/drain feature (for example, by intentionally over etching). At block 50, a source/drain contact is formed to the exposed source/drain feature in the extended source/drain contact opening. The source/drain contact is formed over the source/drain contact spacers and fills the extended source/drain contact opening. The source/drain contact and the source/drain contact spacers form a source/drain contact structure that enhances performance of the IC device. In some implementations, a silicide feature is formed over the exposed source/drain feature before forming the source/drain contact. In some implementations, an ion implantation process is performed to introduce dopant into the source/drain feature before forming the source/drain contact. At block 60, method 10 can proceed with completing fabrication. In some implementations, where the source/drain contact is a portion of a multi-layer interconnect structure, method 10 can proceed with forming various routing layers to the source/drain contact, which can include a via and a conductive line of a metal layer of the multi-layer interconnect structure. Additional steps can be provided before, during, and after method 10, and some of the steps described can be moved, replaced, or eliminated for additional embodiments of method 10. The discussion that follows illustrates IC devices that can be fabricated according to various embodiments of method 10.

FIGS. 2A-2H are fragmentary cross-sectional diagrammatic views of an IC device 100, in portion or entirety, at various fabrication stages of a method, such as method 10 of FIG. 1, according to various aspects of the present disclosure. IC device 100 can be included in a microprocessor, a memory, and/or other IC device. In some implementations, IC device 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2A-2H have been simplified for the sake of clarity to better understand the inventive concepts of the present disclosure. Additional features can be added in IC device 100, and some of the features described below can be replaced, modified, or eliminated in other embodiments of IC device 100.

Figure 2A:
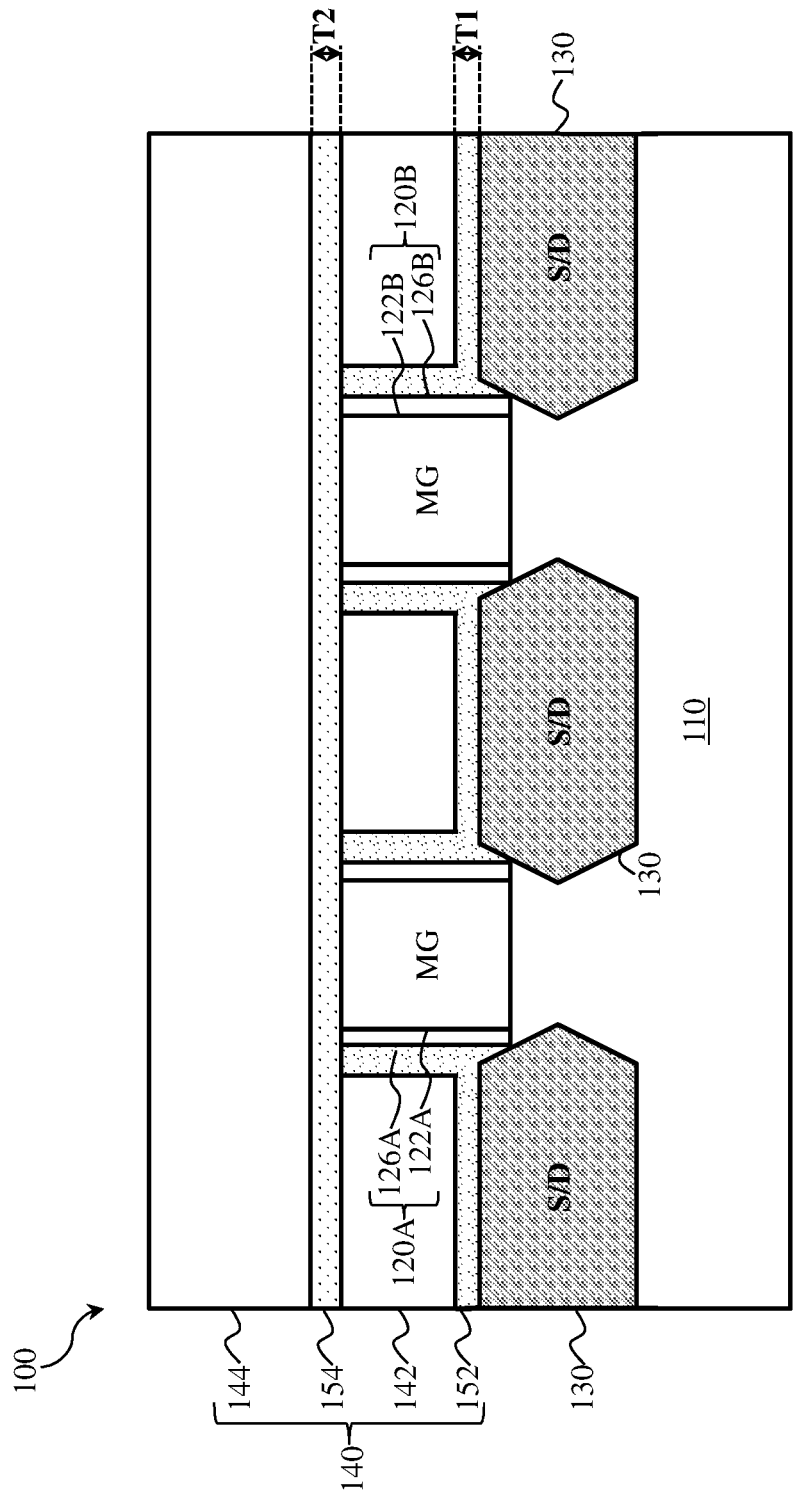
FIGS. 2A-2H are fragmentary cross-sectional diagrammatic views of an integrated circuit device, in portion or entirety, at various fabrication stages of a method, such as the method of FIG. 1, according to various aspects of the present disclosure.

Turning to FIG. 2A, IC device 100 includes a substrate 110, such as a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 110 can include various doped regions (not shown) configured according to design requirements of IC device 100. In some implementations, substrate 110 includes p-type doped regions (for example, p-type wells) doped with p-type dopants, such as boron (for example, $BF_2$), indium, other p-type dopant, or combinations thereof. In some implementations, substrate 110 includes n-type doped regions (for example, n-type wells) doped with n-type dopants, such as phosphorus, arsenic, other n-type dopant, or combinations thereof. In some implementations, substrate 110 includes doped regions formed with a combination of p-type dopants and n-type dopants. The various doped regions can be formed directly on and/or in substrate 110, for example, providing a p-well structure, an n-well structure, a dual-well structure, a raised structure, or combinations thereof. An ion implantation process, a diffusion process, and/or other suitable doping process can be performed to form the various doped regions.

Various gate structures are disposed over substrate 110, such as a gate structure 120A and a gate structure 120B. Gate structures 120A, 120B each interpose a source region and a drain region, where a channel region is defined in substrate 110 between the source region and the drain region. Gate structures 120A, 120B engage the channel regions, such that current can flow between the source/drain regions during operation. In some implementations, gate structures 120A, 120B are formed over a fin structure, such that gate structures 120A, 120B each wrap a portion of the fin structure. For example, gate structures 120A, 120B wrap channel regions of the fin structure, thereby interposing source regions and drain regions of the fin structure. Gate structures 120A, 120B include metal gate (MG) stacks, such as a metal gate stack 122A and a metal gate stack 122B. Metal gate stacks 122A, 122B are configured to achieve desired functionality according to design requirements of IC device 100, such that metal gate stacks 122A, 122B include the same or different layers and/or materials. In the depicted embodiment, metal gate stacks 122A, 122B include a gate dielectric and a gate electrode. The gate dielectric is disposed on substrate 110, and the gate electrode is disposed on the gate dielectric. In some implementations, the gate dielectric is conformally disposed on sidewall surfaces and bottom surfaces of IC device 100 defining metal gate stacks 122A, 122B, such that the gate dielectric is generally u-shaped and has a substantially uniform thickness. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents and/or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Metal gate stacks 122A, 122B are fabricated according to a gate last process, a gate first process, or a hybrid gate last/gate first process. In gate last process implementations, gate structures 120A, 120B include dummy gate stacks that are subsequently replaced with metal gate stacks 122A, 122B. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 122A, 122B are formed. In some implementations, the dummy gate stacks are formed before forming an interlayer dielectric layer, and the dummy gate stacks are replaced with metal gate stacks 122A, 122B after forming the interlayer dielectric layer. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof.

Gate structures 120A, 120B further respectively include gate spacers 126A and gate spacers 126B, which are disposed adjacent to (for example, along sidewalls of) metal gate stacks 122A, 122B, respectively. Gate spacers 126A, 126B are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and subsequently anisotropically etched to form gate spacers 126A, 126B. In some implementations, gate spacers 126A, 126B include a multilayer structure, such as a first dielectric layer that includes silicon nitride and a second dielectric layer that includes silicon oxide. In some implementations, gate spacers 126A, 126B include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 110 and subsequently anisotropically etched to form a first spacer set adjacent to gate stacks, and a second dielectric layer including silicon and nitrogen can be deposited over substrate 110 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIG. 2A) in source/drain (S/D) regions before and/or after forming gate spacers 126A, 126B.

Epitaxial source features and epitaxial drain features (referred to as epitaxial source/drain features) are disposed in source/drain regions of substrate 110. For example, a semiconductor material is epitaxially grown on substrate 110, forming epitaxial source/drain features 130 over source/drain regions of substrate 110. In the depicted embodiment, gate structures 120A, 120B interpose respective epitaxial source/drain features 130, and respective channel regions are defined in substrate 110 between respective epitaxial source/drain features 130 underneath respective gate structures 120A, 120B. IC device 100 can thus be configured to include a transistor including gate structure 120A and its corresponding epitaxial source/drain features 130 and channel region and a transistor including gate structure 120B and its corresponding epitaxial source/drain features 130 and channel region. In some implementations, epitaxial source/drain features 130 wrap source/drain regions of one or more fin structures extending from substrate 110, such that the transistors are configured as Fin-FETs. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 110. Epitaxial source/drain features 130 are doped with n-type dopants and/or p-type dopants. In some implementations, where a transistor is configured as an n-type device, epitaxial source/drain features 130 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device, epitaxial source/drain features 130 can be silicon-and-germanium-containing epitaxial layers doped with boron, other p-type dopant, or combinations thereof (for example, forming Si:Ge:B epitaxial layers). In some implementations, epitaxial source/drain features 130 include materials and/or dopants that achieve desired tensile stress and/or compressive stress in the channel region. In some implementations, epitaxial source/drain features 130 are doped during deposition by adding impurities to a source material of the epitaxy process. In some implementations, epitaxial source/drain features 130 are doped by an ion implantation process after a deposition process. In some implementations, annealing processes are performed to activate dopants in epitaxial source/drain features 130 and/or other source/drain regions of IC device 100 (for example, HDD regions and/or LDD regions disposed in substrate 110 and/or epitaxial source/drain features 130).

An isolation feature(s) (not shown) is formed over and/or in substrate 110 to isolate various regions, such as various device regions, of IC device 100. For example, isolation features define and electrically isolate active device regions and/or passive device regions from each other. In some implementations, an isolation feature can be configured to isolate transistors corresponding with gate structures 120A, 120B and epitaxial source/drain features 130 from other transistors, devices, and/or regions of IC device 100. Isolation features include an isolation material, such as silicon oxide, silicon nitride, silicon oxynitride, other suitable isolation material (for example, including silicon, oxygen, nitrogen, carbon, and/or other suitable isolation constituent), or combinations thereof. Isolation features can include different structures, such as shallow trench isolation (STI) structures, deep trench isolation (DTI) structures, and/or local oxidation of silicon (LOCOS) structures. In some implementations, STI features can be formed by etching trenches in substrate 110 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of the STI features. In some implementations, STI features can be formed by depositing an insulator material over substrate 110 after forming fins, such that the insulator material layer fills gaps (trenches) between fins, and etching back the insulator material layer. In some implementations, isolation features include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features include a dielectric layer disposed over a doped liner layer (including, for example, boron silicate glass or phosphosilicate glass).

A multilayer interconnect (MLI) feature 140 is disposed over substrate 110. MLI feature 140 electrically couples various devices (for example, transistors, resistors, capacitors, and/or inductors) and/or components (for example, gate structures and/or source/drain features) of IC device 100, such that the various devices and/or components operate as specified by design requirements of IC device 100. MLI feature 140 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines. Vertical interconnect features typically connect horizontal interconnect features in different layers (or different planes) of MLI feature 140. During operation, MLI feature 140 routes signals between the devices and/or the components of IC device 100 and/or distribute signals (for example, clock signals, voltage signals, and/or ground signals) to the devices and/or the components of IC device 100. Though MLI feature 140 is depicted with a given number of dielectric layers and conductive layers, the present disclosure contemplates MLI feature 140 having more dielectric layers and/or conductive layers or less dielectric layers and/or conductive layers.

In FIG. 2A, MLI feature 140 includes an interlayer dielectric layer 142 disposed over substrate 110 and an interlayer dielectric layer 144 disposed over ILD layer 142. ILD layers 142, 144 include a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In furtherance of the depicted embodiment, ILD layers 142, 144 include an oxygen-containing material, such as silicon oxide (in such implementations, ILD layers 142, 144 can be referred to as oxide layers). In some implementations, ILD layers 142, 144 can include a multilayer structure having multiple dielectric materials. ILD layers 142, 144 are formed over substrate 110, for example, by a deposition process (such as CVD, PVD, ALD, HDPCVD, MOCVD, RPCVD, PECVD, LPCVD, ALCVD, APCVD, other suitable methods, or combinations thereof). In some implementations, ILD layers 142, 144 are formed by a flowable CVD (FCVD) process that includes, for example, depositing a flowable material (such as a liquid compound) over substrate 110 and converting the flowable material to a solid material by a suitable technique, such as thermal annealing and/or ultraviolet radiation treating. Subsequent to the deposition of ILD layers 142, 144, a CMP process and/or other planarization process is performed, such that ILD layers 142, 144 have substantially planar surfaces.

MLI feature 140 further includes one or more contact etch stop layers (CESL) disposed over substrate 110, such as a CESL 152 disposed between ILD layer 142 and device-level features (here, gate structures 120A, 120B and epitaxial source/drain features 130) and a CESL 154 disposed between ILD layer 142 and ILD layer 144. CESLs 152, 154 include a material different than ILD layers 142, 144 to achieve etching selectivity during processing, such that CESLs 152, 154 can be selectively etched relative to ILD layers 142, 144 (in other words, with no or minimal etching of ILD layers 142, 144), and vice versa. For example, CESLs 152, 154 include a dielectric material that is different than the dielectric material of ILD layers 142, 144. The dielectric material can be silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In the depicted embodiment, where ILD layers 142, 144 include an oxygen-containing material, CESLs 152, 154 include a nitrogen-containing material. For example, CESLs 152, 154 include silicon and nitrogen, such as silicon nitride or silicon oxynitride, such that CESLs 152, 154 can be referred to as nitride layers. In some implementations, CESLs 152, 154 can include a multilayer structure having multiple dielectric materials. CESLs 152, 154 are formed by a deposition process, such as CVD, PVD, ALD, HDPCVD, MOCVD, RPCVD, PECVD, LPCVD, ALCVD, APCVD, other suitable methods, or combinations thereof. In the depicted embodiment, CESL 152 is conformally deposited by ALD or other suitable deposition process, such that CESL 152 has a thickness T1 that is substantially uniform over surfaces of IC device 100 (here, substrate 110, gate structure 120A, 120B, and/or epitaxial source/drain features 130). In furtherance of the depicted embodiment, CESL 154 is conformally deposited by ALD or other suitable process, such that CESL 154 has a thickness T2 that is substantially uniform over surfaces of IC device 100 (here, gate structure 120A, 120B, ILD layer 142, and/or CESL 152). CESLs 152, 154 have the same or different thicknesses depending on design and processing requirements of IC device 100. In some implementations, thickness T1 is substantially the same as thickness T2. In some implementations, thickness T1 is about 1 nm to about 10 nm. In some implementations, thickness T2 is about 1 nm to about 10 nm. In some implementations, after deposition of CESLs 152, 154, a CMP process and/or other planarization process may be performed, such that CESLs 152, 154 have substantially planar surfaces.

Figure 2B:
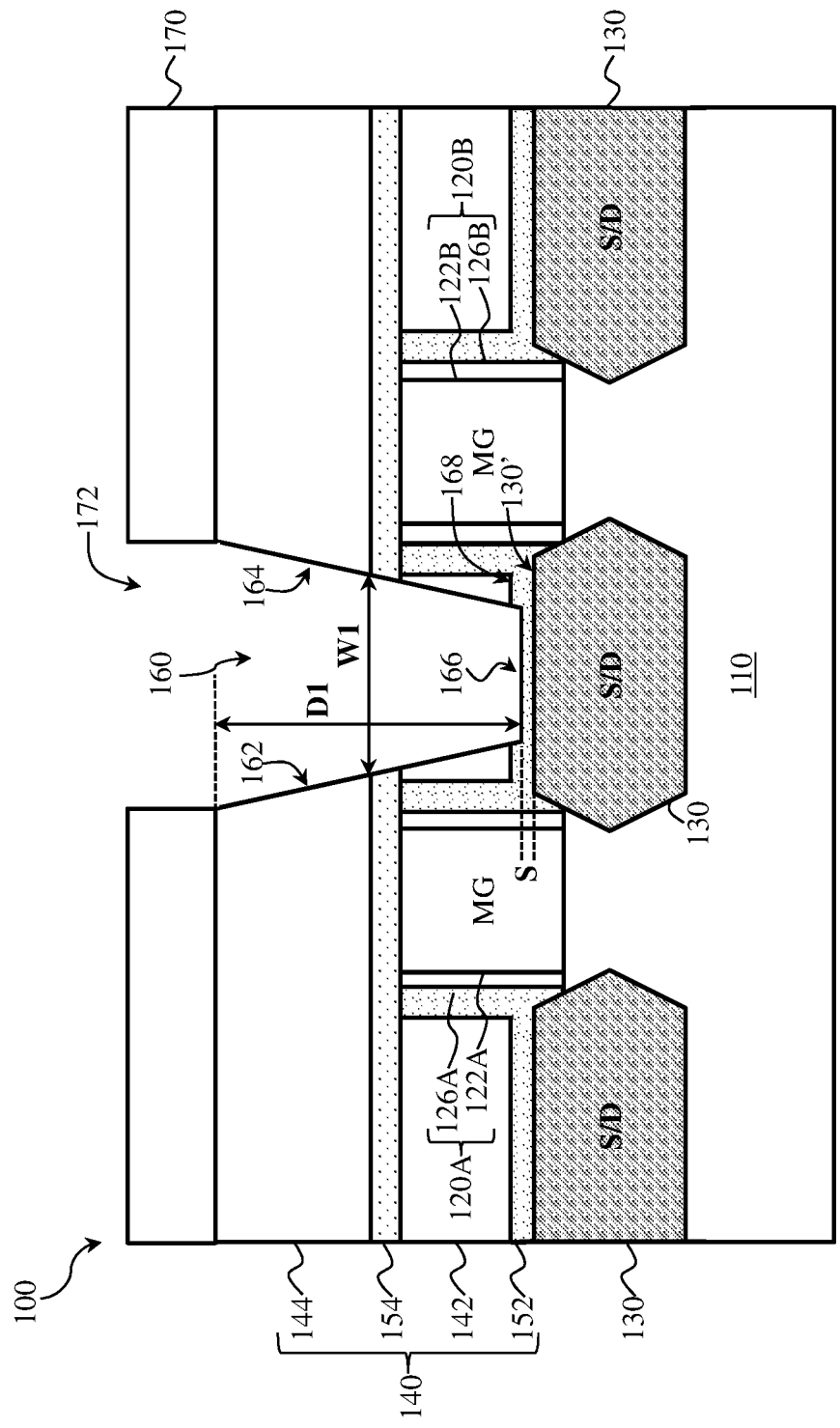

Turning to FIG. 2B, a source/drain contact opening 160 is formed that exposes at least a portion of CESL 152 overlying at least one of epitaxial source/drain features 130. For example, source/drain contact opening 160 extends completely through ILD layer 144, CESL 154, and ILD layer 142 to expose a portion of CESL 152 overlying epitaxial source/drain feature 130, which is disposed between gate structures 120A, 120B. In the depicted embodiment, source/drain contact opening 160 extends partially through CESL 152, which can result from unintentional etching of CESL 152 (caused, for example, by inherent processing limitations associated with achieving complete etching selectivity between CESL 152 and ILD layer 142) or intentional etching of CESL 152. Source/drain contact opening 160 thus includes a sidewall 162 (defined by ILD layer 144, CESL 154, ILD layer 142, and CESL 152), a sidewall 164 (defined by ILD layer 144, CESL 154, ILD layer 142, and CESL 152), and a bottom 166 (defined by CESL 152) that extends between sidewall 162 and sidewall 164. Because CESL 152 is partially (minimally) etched, bottom 166 is defined by a recessed top surface of CESL 152 in the depicted embodiment. In some implementations, bottom 166 is defined by a top surface of CESL 152 (for example, when no etching of CESL 152 occurs and a top surface of CESL 152 overlying epitaxial source/drain feature 130 remains substantially planar). In such implementations, sidewalls 162, 164 are not partially defined by CESL 152. A depth D1 of source/drain contact opening 160 is defined between a top surface of ILD layer 144 and a top surface of CESL 152 (here, the recessed top surface), and a width W1 of source/drain contact opening 160 is defined between sidewall 162 and sidewall 164. Depth D1 is configured to ensure that source/drain contact opening 160 does not expose epitaxial source/drain feature 130, such that a space S is defined between bottom 166 and a top surface 130' of epitaxial source/drain feature 130. In some implementations, depth D1 is about 10 nm to about 200 nm. In some implementations, space S is less than or equal to about 10 nm. Width W1 is configured to allow sufficient space for forming source/drain contact spacers and a source/drain contact. In some implementations, width W1 is about 10 nm to about 200 nm. In the depicted embodiment, source/drain contact opening 160 has a tapered width, such that width W1 decreases from top to bottom. The present disclosure contemplates any width profile for source/drain contact opening 160 depending on processing and/or design requirements of the source/drain spacers and/or source/drain contact (for example, a tapered width that increases from top to bottom or a substantially uniform width from top to bottom of source/drain contact opening 160). The present disclosure further contemplates forming more than one source/drain contact opening 160, such as source/drain contact openings to more than one epitaxial source/drain feature 130. In some implementations, depending on design requirements and processing, width W1 may be greater than depicted, such that source/drain contact opening 160 exposes CESL 152 disposed along gate spacers 126A and/or gate spacers 126B or exposes gate spacers 126A and/or gate spacers 126B.

ILD layer 144, CESL 154, and ILD layer 142 can be patterned by a lithography and etching process. For example, forming source/drain contact opening 160 includes performing a lithography process to form a patterned mask layer 170 over ILD layer 144 and performing an etching process to transfer a pattern defined by one or more openings 172 in patterned mask layer 170 to ILD layer 144, CESL 154, and ILD layer 142. The lithography process can include forming a resist layer over ILD layer 144 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Alternatively, the exposure process can be implemented or replaced by other methods, such as maskless lithography, electron-beam writing, ion-beam writing, and/or nanoimprint technology. Since the resist layer is sensitive to radiation energy, exposed (or non-exposed) portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. In some implementations, patterned mask layer 170 is the patterned resist layer. In some implementations, the patterned resist layer is used as an etch mask to remove portions of a hard mask layer, thereby forming patterned mask layer 170.

The etching process then uses patterned mask layer 170 as an etch mask to remove portions of ILD layer 144, CESL 154, and ILD layer 142 exposed by opening 172, thereby forming source/drain contact opening 160 that exposes the portion of CESL 152 overlying epitaxial source/drain feature 130. CESL 152 functions as an etch stop layer during the etching process. Because ILD layers 142, 144 include a dielectric material having different etching characteristics than a dielectric material of CESLs 152, 154, the etching process can selectively etch ILD layers 144, 142 without (or minimally) etching CESLs 152, 154. For example, an etching chemistry can be tuned throughout the etching process to selectively etch silicon oxide without (or minimally) etching silicon nitride, or vice versa. In some implementations, the etching process is a three stage process that includes a first etching stage having a first etching chemistry that selectively etches ILD layer 144 (for example, silicon oxide) without (or minimally) etching patterned masking layer 170 and/or CESL 154; a second etching stage having a second etching chemistry that selectively etches CESL layer 154 (for example, silicon nitride) without (or minimally) etching patterned masking layer 170, ILD layer 144, and/or ILD layer 142; and a third etching stage having a third etching chemistry that selectively etches ILD layer 142 (for example, silicon oxide) without (or minimally) etching patterned masking layer 170 and/or CESL 152. In some implementations, an etching chemistry is tuned throughout the etching process, such that etching selectivity between ILD layers 142, 144 and CESLs 152, 154 changes throughout the etching process. For example, the etching chemistry can be configured to increase etching selectivity between silicon oxide and silicon nitride over an etching time, such that the etching chemistry initially exhibits less etching selectivity (or even no etching selectivity) between silicon oxide and silicon nitride (for example, as the etching process removes portions of ILD layer 144 and CESL 154) and then exhibits increased etching selectivity as the etching time progresses until the etching chemistry is configured to etch silicon oxide without (or minimally) etching silicon nitride (for example, as the etching process removes portions of ILD layer 142), such that the etching process stops upon reaching CESL 152. In some implementations, the etching process is performed for an etching time that ensures no or minimal etching of CESL 152. The etching process can include a dry etching process, a wet etching process, other suitable etching process, or combinations thereof. A dry etching process uses a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. A wet etching process implements an etching solution that includes TMAH, $NH_4OH$, $H_2O_2$, $H_2SO_4$, HF, HCl, other suitable wet etching constituent, or combinations thereof. Various etching parameters can be tuned to achieve selective etching, such as etchant composition, etching temperature, etching solution concentration, etching time, etching pressure, source power, RF bias voltage, RF bias power, etchant flow rate, other suitable etching parameters, or combinations thereof. After the etching process, patterned mask layer 170 can be removed from ILD layer 144, for example, by an etching process and/or a resist stripping process.

Figure 2C:
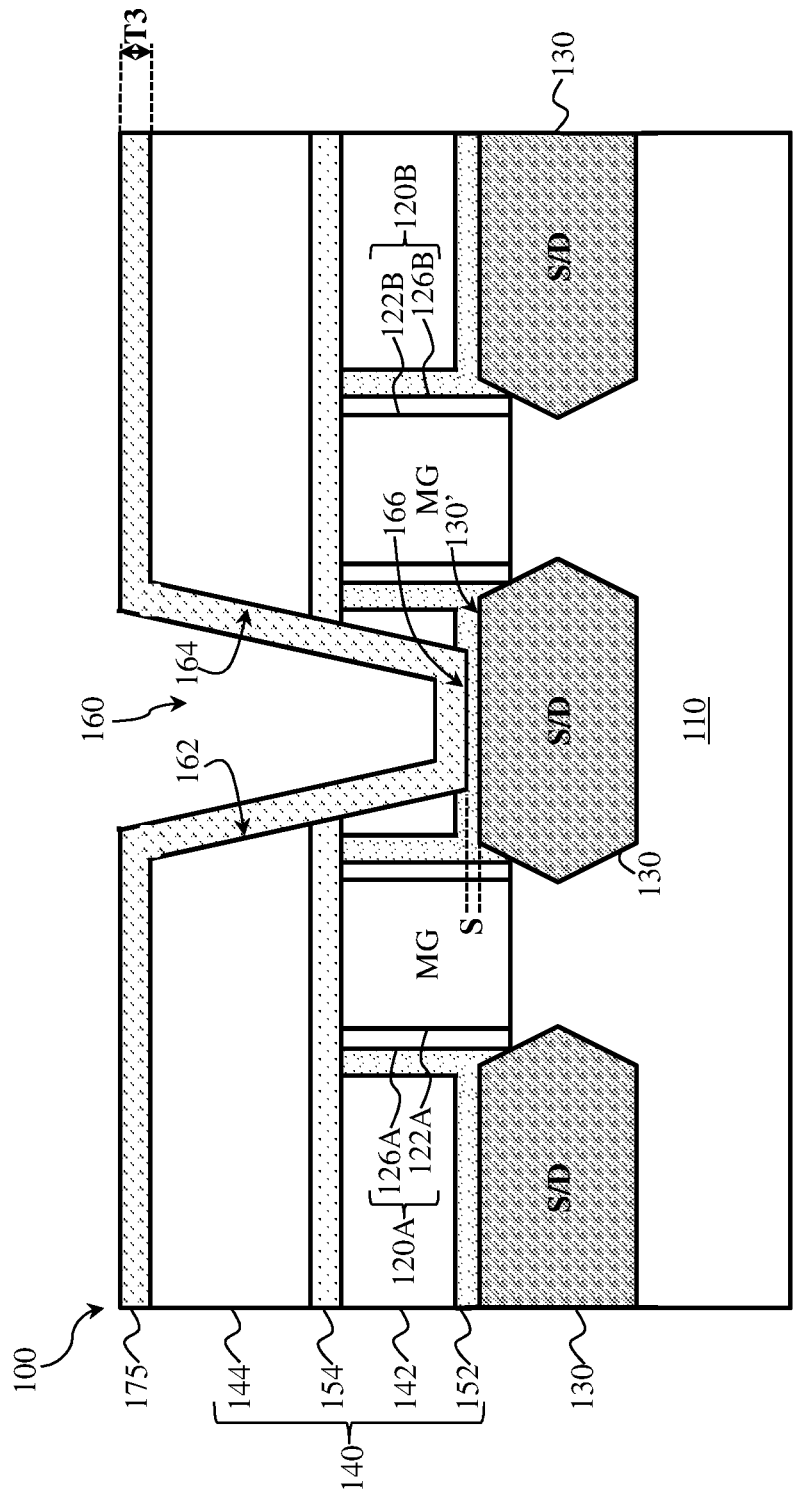

Turning to FIG. 2C, a source/drain contact spacer layer 175 is formed in source/drain contact opening 160. Source/drain contact spacer layer 175 lines and partially fills source/drain contact opening 160. In the depicted embodiment, source/drain contact spacer layer 175 is disposed directly on the top surface of ILD layer 144, sidewalls 162, 164 of source/drain contact opening 160 (here, defined by ILD layer 144, CESL 154, ILD layer 142, and CESL 152), and bottom 166 of source/drain contact opening 160 (here, defined by CESL 152). Source/drain contact spacer layer 175 includes a material different than ILD layers 142, 144 to achieve etching selectivity during processing, such that source/drain contact spacer layer 175 can be selectively etched relative to ILD layers 142, 144 (in other words, with no or minimal etching of ILD layers 142, 144). For example, source/drain contact spacer layer 175 includes a dielectric material that is different than the dielectric material of ILD layers 142, 144. The dielectric material can be silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In some implementations, source/drain contact spacer layer 175 includes the same material as CESL 152. For example, in the depicted embodiment, source/drain contact spacer layer 175 includes silicon and nitrogen, such as silicon nitride or silicon oxynitride (in such implementations, source/drain contact spacer layer 175 can be referred to as a nitride layer). In some implementations, source/drain contact spacer layer 175 and CESL 152 include different materials. Source/drain contact spacer layer 175 is formed by a deposition process, such as CVD, PVD, ALD, HDP-CVD, MOCVD, RPCVD, PECVD, LPCVD, ALCVD, APCVD, other suitable process, or combinations thereof. For example, source/drain contact spacer layer 175 is conformally deposited by ALD or other suitable deposition process, such that source/drain contact spacer layer 175 has a thickness T3 that is substantially uniform over surfaces of IC device 100 (here, ILD layers 142, 144 and CESLs 152, 154). In some implementations, thickness T3 is about 1 nm to about 10 nm.

Figure 2D:
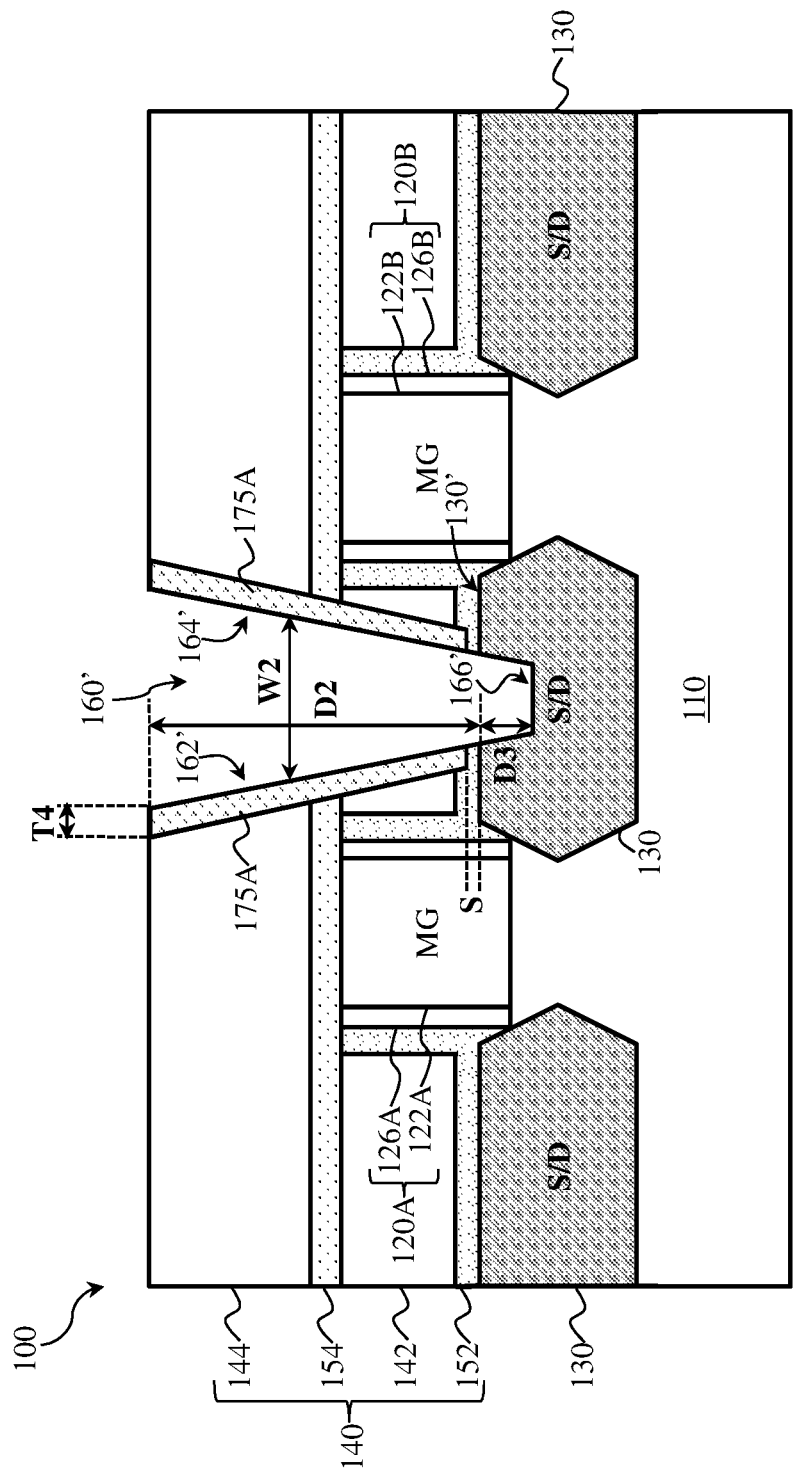

Turning to FIG. 2D, an etching process is performed that extends source/contact opening 160 to expose epitaxial source/drain feature 130, thereby forming source/drain contact spacers 175A in an extended source/drain contact opening 160'. Source/drain contact spacers 175A have thickness T4. In the depicted embodiment, thickness T4 is less than thickness T3 as a result of the etching process. In some implementation, thickness T4 tapers as a result of the etching process, for example, decreasing as a depth of extended source/drain contact opening 160' increases. In some implementations, thickness T4 is substantially uniform as the depth of extended source/drain contact opening 160' increases. In some implementations, thickness T4 increases as a depth of extended source/drain contact opening 160' increases. Because source/drain contact opening 160 is initially formed to CESL 152, source/drain contact spacers 175A do not physically contact epitaxial source/drain feature 130. Instead, CESL 152 (and thus space S) remains between source/drain contact spacers 175A and epitaxial source/drain feature 130, which improves performance of IC device 100 as described herein. In the depicted embodiment, after the etching process, extended source/drain contact opening 160' includes a sidewall 162' (defined by source/drain contact spacer 175A, CESL 152, and epitaxial source/drain feature 130), a sidewall 164' (defined by source/drain contact spacer 175A, CESL 152, and epitaxial source/drain feature 130), and a bottom 166' (defined by epitaxial source/drain feature 130) that extends between sidewall 162' and sidewall 164'. In furtherance of the depicted embodiment, bottom 166' is defined by a recessed top surface of epitaxial source/drain feature 130 (here a surface of epitaxial source/drain feature 130 that is below top surface 130'), which results from the etching process intentionally over etching to ensure that extended source/drain contact opening 160' exposes a sufficient portion of epitaxial source/drain feature 130. For purposes of the present disclosure, exposed surfaces of epitaxial source/drain feature 130, which define bottom 166', a portion of sidewall 162', and a portion of sidewall 164' are collectively referred to herein as a source/drain contact surface. A total depth of extended source/drain contact opening 160' is thus a sum of a depth D2 (defined between a top surface of ILD layer 144 and top surface 130' of epitaxial source/drain feature 130) and a depth D3 (defined between top surface 130' of epitaxial source/drain feature 130 and bottom 166' (defined by the recessed top surface of epitaxial source/drain feature 130)). In some implementations, depth D2 is about 10 nm to about 200 nm, and depth D3 is about 0 nm to about 20 nm. In some implementations, depth D3 is less than or equal to about 3.5 nm. Extended source/drain contact opening 160' further has a width W2 that is less than width W1. In FIG. 2D, extended source/drain contact opening 160' has a tapered width, such that width W2 decreases from top to bottom. The present disclosure contemplates any width profile for extended source/drain contact opening 160' depending on processing and/or design requirements of the source/drain contact. For example, in some implementations, a width of extended source/drain contact opening 160' is not tapered, such that width W2 is substantially uniform from top to bottom of extended source/drain contact opening 160'. In some implementations, width W2 increases from top to bottom of extended source/drain contact opening 160'.

Because ILD layers 142, 144 include a dielectric material having different etching characteristics than a dielectric material of source/drain contact spacer layer 175 and CESL 152, the etching process is configured to selectively etch source/drain contact spacer layer 175 and CESL 152 without (or minimally) etching ILD layer 144. In such implementations, no masking (patterning) layer is needed forming extended source/drain contact opening 160'. For example, where source/drain contact spacer layer 175 and CESL 152 are silicon nitride layers and ILD layer 144 is an oxide layer, an etching chemistry can be tuned to selectively etch silicon nitride without (or minimally) etching silicon oxide. In the depicted embodiment, the etching process removes portions of source/drain contact spacer layer 175 over a top surface of ILD layer 144 and a portion of source/drain contact spacer layer 175 over CESL 152, thereby exposing CESL 152. The etching process then continues with removing the exposed CESL 152 until reaching epitaxial source/drain feature 130. In furtherance of the depicted embodiment, the etching process continues with removing a portion of epitaxial source/drain feature 130. In some implementations, an etching chemistry of the etching process is the same for etching source/drain contact spacer layer 175A, CESL 152, and epitaxial source/drain feature 130. For example, an etching chemistry can be tuned to etch silicon nitride, silicon, and/or silicon germanium without (or minimally) etching silicon oxide. In such implementations, the etching chemistry can exhibit an etching selectivity between silicon nitride, silicon, and silicon germanium that achieves a desired removal of epitaxial source/drain epitaxial feature 130. The etching process can include a dry etching process, a wet etching process, other suitable etching process, or combinations thereof. A dry etching process uses a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. A wet etching process implements an etching solution that includes TMAH, $NH_4OH$, $H_2O_2$, $H_2SO_4$, HF, HCl, other suitable wet etching constituent, or combinations thereof. Various etching parameters can be tuned to achieve selective etching, such as etchant composition, etching temperature, etching solution concentration, etching time, etching pressure, source power, RF bias voltage, RF bias power, etchant flow rate, other suitable etching parameters, or combinations thereof. After the etching process, patterned mask layer 170 can be removed from ILD layer 144, for example, by an etching process and/or a resist stripping process.

Figure 2E:
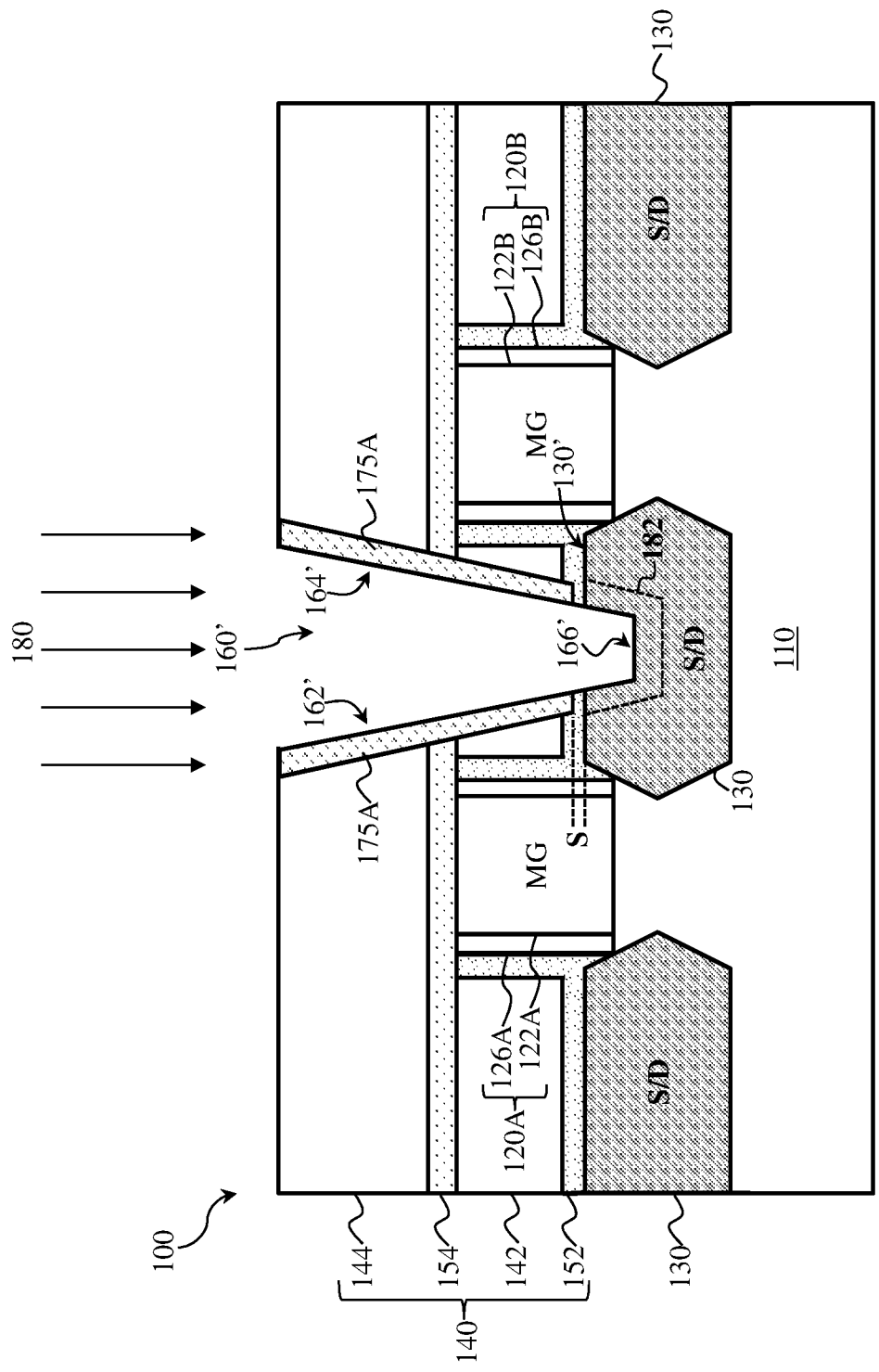

Turning to FIG. 2E, an implantation process 180 is performed to introduce dopants into exposed epitaxial source/drain feature 130. Implantation process 180 increases a dopant concentration at and/or near the source/drain contact surface (here, exposed portions of epitaxial source/drain feature 130), which can reduce source/drain contact resistance, thereby improving performance of IC device 100. In some implementations, implantation process 180 forms a doped region 182 having a dopant concentration that is greater than a dopant concentration of epitaxial source/drain feature 130. Implantation process introduces boron, phosphorous, arsenic, other suitable dopant, or combinations thereof into epitaxial source/drain feature 130. In the depicted embodiment, boron is introduced into epitaxial source/drain feature 130, such that doped region 182 includes boron. In some implementations, the implantation process is a plasma-based doping process that generates a plasma from a dopant gas (including, for example, $B_2H_6$, $BF_3$, $AsH_3$, $PH_3$, other suitable dopant gas precursor, or combinations thereof) and a dilution gas precursor (including, for example, Ar, He, Ne, $H_2$, $O_2$, $N_2$, other suitable dilution gas precursor, or combinations thereof). Annealing processes can be performed to activate the dopants introduced into epitaxial source/drain feature 130 by implantation process 180.

Figure 2F:
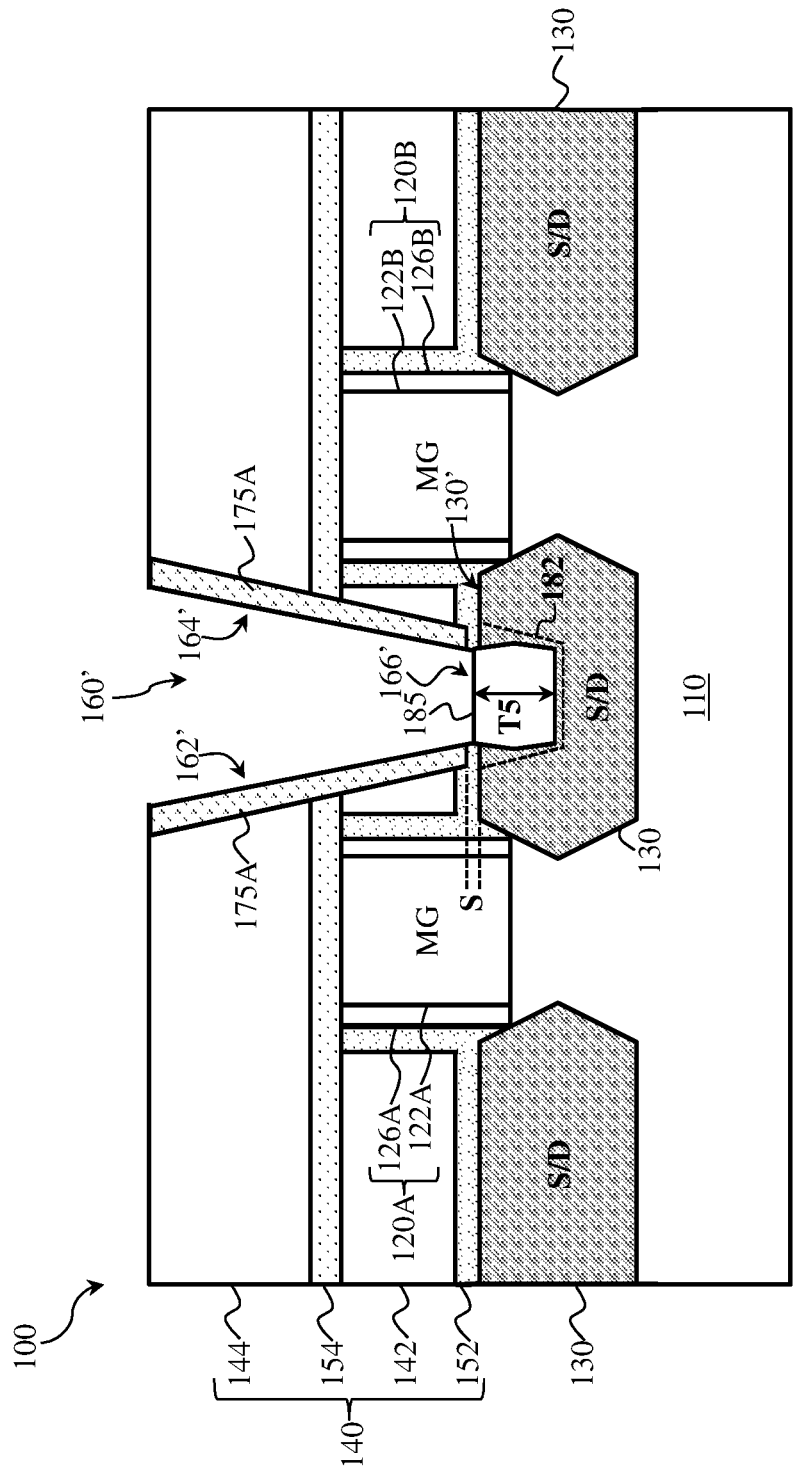

Turning to FIG. 2F, a silicide feature 185 is formed over epitaxial source/drain feature 130, such that silicide feature 185 having a thickness T5 partially fills extended source/drain contact opening 160'. In the depicted embodiment, thickness T5 is greater than or equal to depth D3, such that a portion of silicide feature 185 physically contacts epitaxial source/drain feature 130, CESL 152, and/or source/drain contact spacers 175A. In some implementations, thickness T5 is about 1 nm to about 30 nm. In some implementations, silicide feature 185 is formed by depositing a metal layer over epitaxial source/drain feature 130 by any suitable deposition process. The metal layer includes any metal constituent suitable for promoting silicide formation, such as nickel, platinum, palladium, vanadium, titanium, cobalt, tantalum, ytterbium, zirconium, other suitable metal, or combinations thereof. IC device 100 is then heated (for example, subjected to an annealing process) to cause constituents of epitaxial source/drain features 130 (for example, silicon and/or germanium) to react with metal constituents in the metal layer. The silicide layers thus include a metal constituent and a constituent of epitaxial source/drain features 130 (for example, silicon and/or germanium). In the depicted embodiment, the metal layer is a titanium-containing layer, a cobalt-containing layer, or a nickel-containing layer, such that silicide feature 185 includes titanium, cobalt, or nickel, and silicon and can thus be referred to as a titanium silicide feature, a nickel silicide feature, or a cobalt silicide feature. In some implementations, a portion of the epitaxial source/drain feature 130 is converted into silicide feature 185 during the silicidation process. Any un-reacted metal, such as remaining portions of the metal layer, is selectively removed by any suitable process, such as an etching process.

Figure 2G:
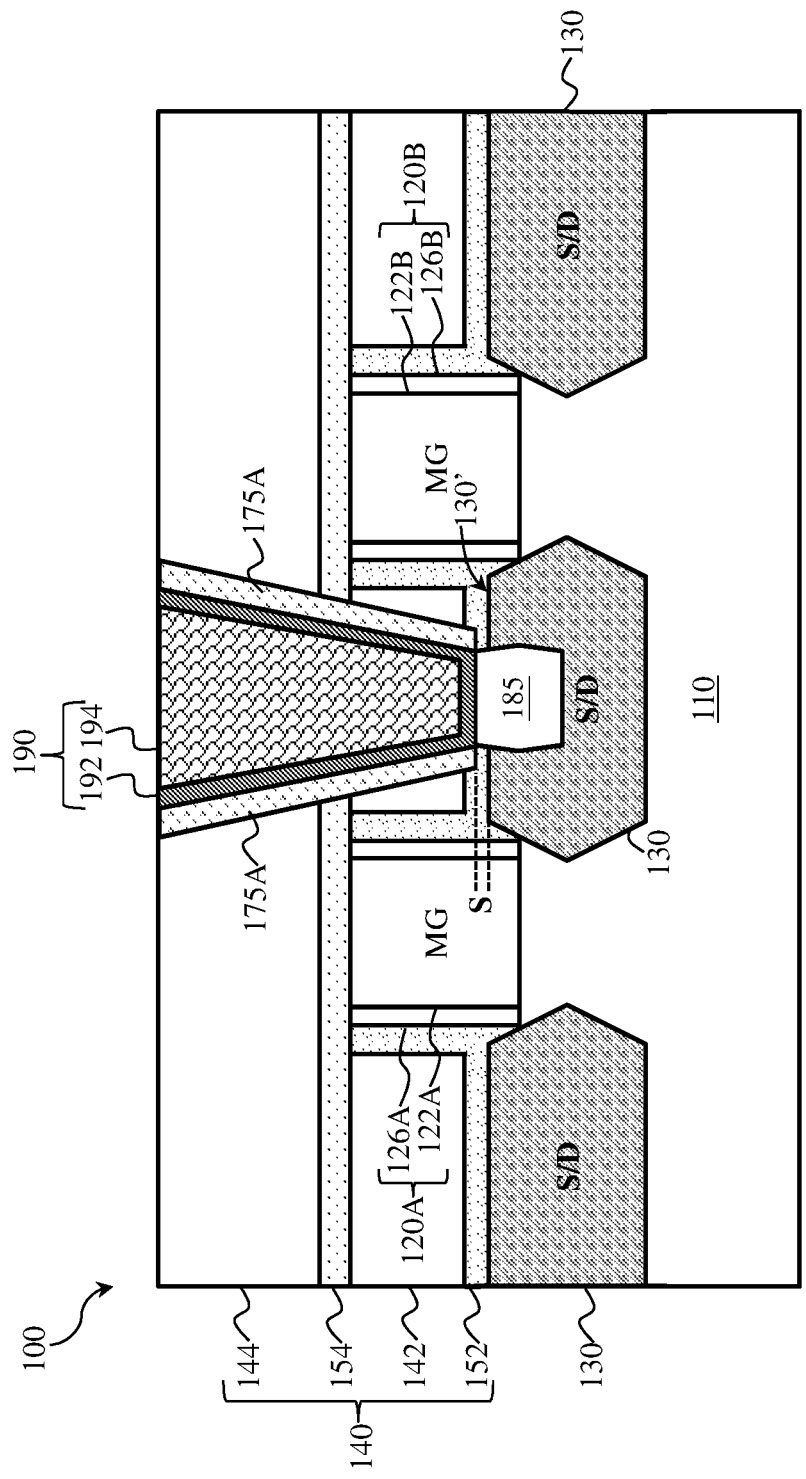

Turning to FIG. 2G, a source/drain contact 190 is formed in any remaining (unfilled) portion of extended source/drain contact opening 160'. Source/drain contact 190 includes a contact liner 192 and a contact bulk layer 194 disposed over contact liner 192. In the depicted embodiment, contact liner 192 is disposed directly on source/drain contact spacers 175A and silicide feature 185 (which define sidewalls 162', 164' and bottom 166' of the remaining portion of extended source/drain contact opening 160'), and contact bulk layer 194 is disposed directly on contact liner 192. Contact liner 192 includes an electrically conductive material that promotes adhesion between a dielectric material (here, of source/drain contact spacers 175A) and contact bulk layer 194, and contact bulk layer 194 includes an electrically conductive material. For example, contact liner 192 and/or contact bulk layer 194 includes titanium, titanium alloy, tantalum, tantalum alloy, cobalt, cobalt alloy, ruthenium, ruthenium alloy, molybdenum, molybdenum alloy, other suitable constituent, or combinations thereof. In the depicted embodiment, contact liner 192 includes tantalum and nitrogen (for example, tantalum nitride) or titanium and nitrogen (for example, titanium nitride), and contact bulk layer 194 includes cobalt, tungsten, or ruthenium. In some implementations, contact liner 192 has a multilayer structure. For example, contact liner 192 includes a first sub-layer that includes titanium or tantalum and a second sub-layer that includes titanium nitride or tantalum nitride. In some implementations, source/drain contact 190 does not include contact liner 192, such that contact bulk layer 194 is disposed directly on source/drain contact spacers 175A and silicide feature 185. Contact liner 192 and/or contact bulk layer 194 are formed by PVD, CVD, ALD, electroplating, electroless plating, other suitable deposition process, or combinations thereof. In the depicted embodiment, contact liner 192 is conformally deposited by an ALD process or other suitable deposition process over ILD layer 144, source/drain contact spacers 175A, and silicide feature 185, such that contact liner 192 has a substantially uniform thickness over ILD layer 144, source/drain contact spacers 175A, and silicide feature 185. In some implementations contact bulk layer 194 is formed by a non-selective deposition process. For example, a blanket deposition process, such as CVD, is performed to deposit contact bulk material over contact liner 192. Thereafter, any excess conductive material(s) can be removed by a planarization process, such as a CMP process, thereby planarizing top surfaces of source/drain contact 190 and ILD layer 144. In some implementations, contact bulk layer 194 is formed by a bottom-up deposition process, which generally refers to a deposition process that fills an opening from bottom to top (which can be referred to as bottom-up fill of the opening). In some implementations, the bottom-up deposition process includes configuring the various parameters of the deposition process to selectively grow contact bulk material from metal surfaces (here, contact liner 192) while limiting (or preventing) growth of the contact bulk material from dielectric surfaces (here, ILD layer 144). Such can be referred to as a selective deposition process.

The source/drain contact structure disclosed herein (source/drain contact spacers 175A and source/drain contact 190) provides desired isolation while enhancing performance of IC device 100. For example, source/drain contact spacers 175A provide additional isolation between source/drain contact 190 and metal gates 120A, 120B (for example, in addition, to gate spacers 126A, 126B, CESL 152, and ILD layer 142) to minimize risks of unintentionally electrically coupling source/drain contact 190 to metal gates 120A, 120B during processing and thus minimizing shorting of transistors of IC device 100. Further, implementing the processes described herein, where source/drain contact spacers 175A are formed before exposing epitaxial source/drain feature 130 (for example, by dividing etching of a source/drain contact opening into two steps), source/drain contact spacers 175A do not physically contact or encroach into source/drain regions of transistors of IC device 100, such as epitaxial source/drain features 130. In other words, source/drain contact spacers 175A do not extend below top surface 130' of epitaxial feature 130 or below a bottom surface of metal gates 122A, 122B. Such configuration ensures that source/drain contact spacers 175A do not block current flowing between source/drain contact 190, epitaxial source/drain features 130 (and thus source/drain regions of the transistors), and channel regions underlying gate structures 120A, 120B. Current thus does not have to flow around source/drain contact spacers 175A to the channel regions, thereby minimizing a current path (length) from source/drain contact 190 to epitaxial source/drain 130 to channel regions underlying gate structures 120A, 120B. This can reduce (or even eliminate) current crowding effects experienced by IC device 100 and/or reduce parasitic source/drain resistance exhibited by IC device 100. Different embodiments may have different advantages, and no particular advantage is required of any embodiment.

Figure 2H:
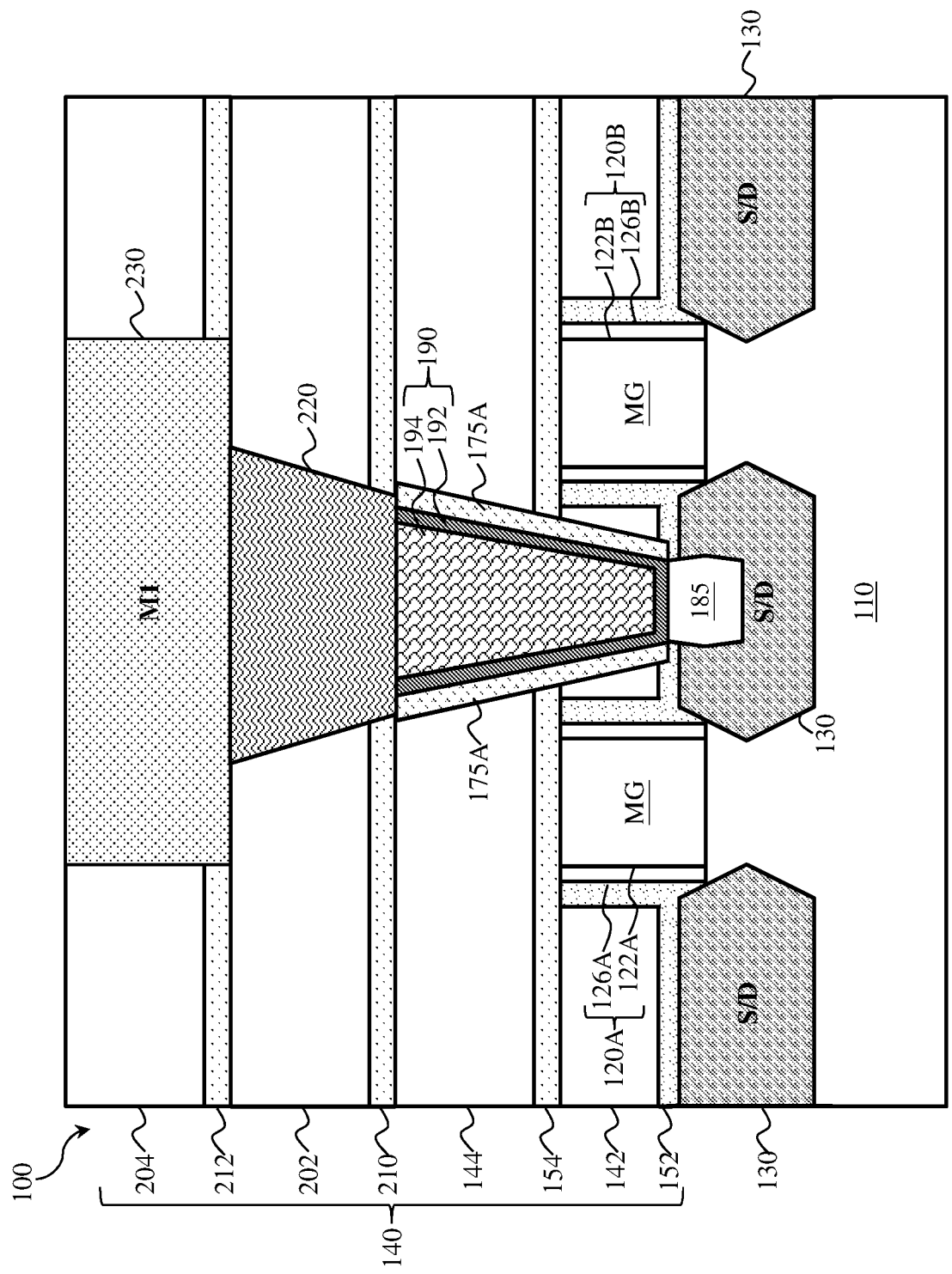

Turning to FIG. 2H, fabrication of IC device 100 can continue, for example, by forming an ILD layer 202 over ILD layer 144, an ILD layer 204 over ILD layer 202, a CESL 210 between ILD layer 144 and ILD layer 202, a CESL 212 between ILD layer 202 and ILD layer 204, a via 220 disposed in ILD layer 202 and CESL 210, and a conductive line 230 disposed in ILD layer 204 and CESL 212. ILD layers 202, 204 are similar to ILD layers 142, 144. CESLs 210, 212 are similar to CESLs 152, 154. Via 220 and conductive line 230 are formed by patterning ILD layers 202, 204 and/or CESLs 210, 212, similar to the patterning of ILD layers 142, 144 and CESLs 152, 154. For example, patterning ILD layers 202, 204 and/or CESLs 210, 212 can include lithography processes and/or etching processes to form openings (trenches), such as via openings and/or line openings in respective ILD layers 202, 204 and/or CESLs 210, 212 that are disposed over source/drain contact 190. In some implementations, the lithography processes include forming a resist layer over respective ILD layers 202, 204 and/or CESLs 210, 212 (or a hard mask layer disposed thereover), exposing the resist layer to patterned radiation, and developing the exposed resist layer, thereby forming a patterned resist layer that can be used as a masking element for etching opening(s) in respective ILD layers 202, 204 and/or CESLs 210, 212 (or the hard mask layer disposed thereover, which is then used as a mask for etching opening (s) in respective ILD layers 202, 204 and/or CESL 210, 212). The etching processes include dry etching processes, wet etching processes, other etching processes, or combinations thereof. Thereafter, the opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some implementations, via 220 and/or conductive line 230 includes a bulk layer (also referred to as a conductive plug). In some implementations, via 220 and/or conductive line 230 includes a barrier layer, an adhesion layer, and/or other suitable layer disposed between the bulk layer and respective ILD layers 202, 204 (along with respective CESLs 210, 212). In such implementations, the barrier layer and/or the adhesion layer conform to the contact opening, such that the barrier layer and/or the adhesion layer are disposed on respective ILD layers 202, 204 (along with respective CESLs 210, 212) and the bulk layer is disposed on the barrier layer and/or the adhesion layer. In some implementations, the barrier layer, the adhesion layer, and/or other suitable layer include titanium, titanium alloy (for example, TiN), tantalum, tantalum alloy (for example, TaN), other suitable constituent, or combinations thereof. In some implementations, via 220 and conductive line 230 include different bulk layers and/or different barrier layers. In some implementations, via 220 and conductive line 230 include the same bulk layers and/or the same barrier layers. In some implementations, via 220 and conductive line 230 are formed by a dual damascene process. Thereafter, any excess conductive material(s) can be removed by a planarization process, such as a CMP process, thereby planarizing a top surface of ILD layers 202, 204 and/or CESLs 210, 212, via 220, and/or conductive line 230.

Source/drain contact 190, via 220, and conductive line 230 combine to form an interconnect structure of MLI feature 140. Source/drain contact 190 can be referred to as a device-level contact (also referred to as a local interconnect or a local contact), which electrically couples and physically couples an IC device feature to conductive features of MLI feature 140. For example, source/drain contact 190 is a metal-to-device (MD) contact, which generally refers to a contact to a conductive region of IC device 100, such as source/drain regions (here, epitaxial source/drain feature 130 and/or silicide feature 185). Via 220 extends vertically through ILD layer 202 and CESL 210 to physically and electrically couple interconnect features in different levels (or layers) of MLI feature 140—here, source/drain contact 190 (disposed in a contact layer of MLI feature 140) and conductive line 230 (disposed in a metal-1 (M1) layer of MLI feature 140). In the depicted embodiment, via 220 extends through ILD layer 202 and CESL 210 and conductive line 230 extends through ILD layer 204 and CESL 212, though the present disclosure contemplates embodiments where via 220 and/or conductive line 230 extend through more than one ILD layer and/or CESL of MLI feature 140. Fabrication can then continue to complete fabrication of MLI feature 140. For example, additional levels of MLI feature 140 can be formed over the M1 layer, such as an M2 layer to an Mn layer, where n represents a number of metal layers in MLI feature 140 and each of M2 layer to Mn layer include vias and conductive lines, similar to via 220 and conductive line 230, disposed in a dielectric material. Vias, similar to via 220, can be fabricated to connect adjacent metal layers, such as M2 layer to Mn layer. In some implementations, one or more of the vias may connect non-adjacent metal layers.

The present disclosure provides for many different embodiments. Source/drain contact spacers for improving integrated circuit device performance and methods of forming such are disclosed herein. An exemplary method includes etching an interlevel dielectric (ILD) layer to form a source/drain contact opening that exposes a contact etch stop layer (CESL) disposed over a source/drain feature; depositing a source/drain contact spacer layer that partially fills the source/drain contact opening and covers the ILD layer and the exposed CESL; etching the source/drain contact spacer layer and the CESL to extend the source/drain contact opening to expose the source/drain feature, wherein the etching forms source/drain contact spacers; and forming a source/drain contact to the exposed source/drain feature in the extended source/drain contact opening, wherein the source/drain contact is formed over the source/drain contact spacers and fills the extended source/drain contact opening. The method can further include forming a silicide feature over the source/drain feature before forming the source/drain contact. The method can further include performing an ion implantation process to introduce dopant into the source/drain feature before forming the source/drain contact.

In some implementations, the etching the ILD layer includes selectively etching the ILD layer without substantially etching the CESL. In some implementations, the etching the source/drain contact spacer layer and the CESL includes removing a portion of the source/drain feature. In some implementations, the etching the ILD layer includes etching a portion of the CESL disposed over the source/drain feature. In some implementations, a material of the source/drain contact spacer layer and a material of the CESL is different than a material of the ILD layer. In some implementations, a material of the source/drain contact spacer layer is the same as a material of the CESL. In some implementations, the etching the source/drain contact spacer layer and the CESL includes selectively etching the source/drain contact spacer layer and the CESL without substantially etching the ILD layer.

Another exemplary method includes forming a first contact etch stop layer (CESL) over an epitaxial source/drain feature disposed between a first gate structure and a second gate structure, a first interlayer dielectric (ILD) layer over the first CESL, a second CESL over the first ILD layer, and a second ILD layer over the second CESL; performing a first etching process to form a source/drain contact opening that extends through the second ILD layer, the second CESL, and the first ILD layer to expose the first CESL that is disposed over the epitaxial source/drain feature; forming a dielectric liner along sidewalls and a bottom of the source/drain contact opening, wherein the sidewalls are defined by the second ILD layer, the second CESL, and the first ILD layer, and further wherein the bottom is defined by the first CESL; performing a second etching process to remove a portion of the dielectric liner and the first CESL, thereby extending the source/drain contact opening to expose the epitaxial source/drain feature and form dielectric spacers; and filling the extended source/drain contact opening with a conductive material. In some implementations, during the first etching process, an etching chemistry is tuned to increase etching selectivity between a material of the first ILD layer and the second ILD layer relative to the first CESL and the second CESL as a depth of the source/drain contact opening increases, such that the first etching process stops upon reaching the first CESL.

In some implementations, the first etching process removes a portion of the first CESL, such that a recessed top surface of the first CESL defines a bottom of the source/ drain contact opening. In some implementations, the forming the dielectric liner includes performing a conformal deposition process, such that the dielectric liner includes a substantially uniform thickness. In some implementations, a material of the dielectric liner is the same as a material of the first CESL. In some implementations, the performing the second etching process includes selectively etching the dielectric liner and the first CESL without substantial etching of the first ILD layer and the second ILD layer. In some implementations, the performing the second etching process includes removing a portion of the epitaxial source/drain feature. In some implementations, the filling the extended source/drain contact opening with the conductive material includes depositing a contact liner layer in the extended source/drain contact opening, depositing a contact bulk layer over the contact liner layer, and performing a planarization process on the contact liner layer and the contact bulk layer.

An exemplary integrated circuit device includes a gate structure disposed over a substrate, a source/drain feature disposed adjacent to the gate structure, and a source/drain contact disposed over the source/drain feature. The source/drain contact extends through an interlevel dielectric (ILD) layer and a contact etch stop layer (CESL) to the source/drain feature. The integrated circuit device further includes source/drain contact spacers disposed between sidewalls of the source/drain contact and the ILD layer. A portion of the CESL is disposed between the source/drain contact spacers and the source/drain feature, such that the source/drain contact spacers do not physically contact the source/drain feature. In some implementations, a material of the source/drain contact spacers is the same as a material of the CESL. In some implementations, the source/drain contact spacers extend partially through the CESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching an interlevel dielectric (ILD) layer to form a source/drain contact opening that exposes a contact etch stop layer (CESL) disposed over a source/drain feature;
   depositing a source/drain contact spacer layer that partially fills the source/drain contact opening and covers the ILD layer and the exposed CESL;
   etching the source/drain contact spacer layer and the CESL to extend the source/drain contact opening to expose the source/drain feature, wherein the etching forms a source/drain contact spacer; and
   forming a source/drain contact to the exposed source/drain feature in the extended source/drain contact opening, wherein the source/drain contact is formed over the source/drain contact spacer and fills the extended source/drain contact opening.

2. The method of claim 1, wherein the etching the ILD layer includes selectively etching the ILD layer without substantially etching the CESL.

3. The method of claim 1, wherein the etching the source/drain contact spacer layer and the CESL includes removing a portion of the source/drain feature.

4. The method of claim 1, wherein the etching the ILD layer includes etching a portion of the CESL disposed over the source/drain feature.

5. The method of claim 1, wherein a material of the source/drain contact spacer layer and a material of the CESL is different than a material of the ILD layer.

6. The method of claim 5, wherein a material of the source/drain contact spacer layer is the same as a material of the CESL.

7. The method of claim 1, wherein the etching the source/drain contact spacer layer and the CESL includes selectively etching the source/drain contact spacer layer and the CESL without substantially etching the ILD layer.

8. The method of claim 1, further comprising forming a silicide feature over the source/drain feature before forming the source/drain contact.

9. The method of claim 1, further comprising performing an ion implantation process to introduce dopant into the source/drain feature before forming the source/drain contact.

10. A method comprising:
    forming a first contact etch stop layer (CESL) over an epitaxial source/drain feature disposed between a first gate structure and a second gate structure, a first interlayer dielectric (ILD) layer over the first CESL, a second CESL over the first ILD layer, and a second ILD layer over the second CESL;
    performing a first etching process to form a source/drain contact opening that extends through the second ILD layer, the second CESL, and the first ILD layer to expose the first CESL that is disposed over the epitaxial source/drain feature;
    forming a dielectric liner along sidewalls and a bottom of the source/drain contact opening, wherein the sidewalls are defined by the second ILD layer, the second CESL, and the first ILD layer, and further wherein the bottom is defined by the first CESL;
    performing a second etching process to remove a portion of the dielectric liner and the first CESL, thereby extending the source/drain contact opening to expose the epitaxial source/drain feature and form dielectric spacers; and
    filling the extended source/drain contact opening with a conductive material.

11. The method of claim 10, wherein during the first etching process, an etching chemistry is tuned to increase etching selectivity between a material of the first ILD layer and the second ILD layer relative to the first CESL and the second CESL as a depth of the source/drain contact opening increases, such that the first etching process stops upon reaching the first CESL.

12. The method of claim 11, wherein the first etching process removes a portion of the first CESL, such that a recessed top surface of the first CESL defines a bottom of the source/drain contact opening.

13. The method of claim 10, wherein the forming the dielectric liner includes performing a conformal deposition process, such that the dielectric liner includes a substantially uniform thickness.

14. The method of claim 10, wherein a material of the dielectric liner is the same as a material of the first CESL.

15. The method of claim 10, wherein the performing the second etching process includes selectively etching the dielectric liner and the first CESL without substantial etching of the first ILD layer and the second ILD layer.

16. The method of claim 15, wherein the performing the second etching process includes removing a portion of the epitaxial source/drain feature.

17. The method of claim 10, wherein the filling the extended source/drain contact opening with the conductive material includes:
- depositing a contact liner layer in the extended source/drain contact opening; and
- depositing a contact bulk layer over the contact liner layer; and
- performing a planarization process on the contact liner layer and the contact bulk layer.

18. A method of making an integrated circuit device comprising:
- forming a gate structure over a substrate;
- forming a source/drain feature adjacent to the gate structure; and
- forming a source/drain contact over the source/drain feature, wherein the source/drain contact extends through an interlevel dielectric (ILD) layer and a contact etch stop layer (CESL) to the source/drain feature;
- wherein a source/drain contact spacer is disposed between sidewalls of the source/drain contact and the ILD layer, wherein a portion of the CESL is disposed between the source/drain contact spacer and the source/drain feature, such that the source/drain contact spacer does not physically contact the source/drain feature.

19. The method of claim 18, wherein a material of the source/drain contact spacer is the same as a material of the CESL.

20. The method of claim 18, wherein the source/drain contact spacer extends partially through the CESL.

* * * * *